United States Patent
Venigalla et al.

(10) Patent No.: US 7,056,192 B2
(45) Date of Patent: Jun. 6, 2006

(54) CERIA-BASED POLISH PROCESSES, AND CERIA-BASED SLURRIES

(75) Inventors: Rajasekhar Venigalla, Wappingers Falls, NY (US); James W. Hannah, Ossining, NY (US); Timothy M. McCormack, Poughkeepsie, NY (US); Robert M. Merkling, Jr., Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/711,369

(22) Filed: Sep. 14, 2004

(65) Prior Publication Data

US 2006/0057943 A1   Mar. 16, 2006

(51) Int. Cl.
*B24D 3/00*   (2006.01)
(52) U.S. Cl. .......................... 451/36; 51/307
(58) Field of Classification Search ................ 451/36, 451/41; 51/308, 309, 307; 438/690
See application file for complete search history.

(56) References Cited

U.S. PATENT DOCUMENTS

| 2003/0047710 A1 | 3/2003 | Babu et al. |
| 2003/0092271 A1 | 5/2003 | Jindal et al. |
| 2003/0211747 A1 | 11/2003 | Hedge et al. |
| 2004/0040217 A1 | 3/2004 | Takashina et al. |
| 2004/0127045 A1 * | 7/2004 | Gorantla et al. ............ 438/690 |
| 2004/0221516 A1 * | 11/2004 | Cho et al. ...................... 51/308 |

OTHER PUBLICATIONS

Prior Art—Chemical Processes in Glass Polishing, Cook L.M., J. of Non-crystalline Solids, vol. 120, pp. 152-171.
A CMP Model Combining Density and Time Dependencies, Taber H. Smith, et al., 1999 CMP-MIC conference proceedings.
Chemical Mechanical Planarization of Microelectronic Materials, John Wiley and Sons, Inc., Wiley-Interscience publication, by Joseph M. Steigerwald, Shyam P. Murarka, Ronald J. Gutmann, year 1997, pp. 140-147.

* cited by examiner

*Primary Examiner*—Jacob K. Ackun, Jr.
(74) *Attorney, Agent, or Firm*—Howard M. Cohn; H. Daniel Schnurmann

(57) ABSTRACT

By adding silica to ceria-based CMP slurries the polish process starts much faster than without silica thereby eliminating dead time in the polish process and eliminating process instability caused by changes in the dead time with operating conditions. A slurry for performing chemical mechanical polishing (CMP) of patterned oxides (e.g., STI, PMD, ILD) on a substrate, comprises: ceria particles having a concentration of 1.0–5.0 wt % and silica particles having a concentration of 0.1–5.0 wt %. A ratio of ceria concentration to silica concentration (ceria:silica) is from approximately 10:1 to nearly 1:1 by weight. The ceria particles have a particle size of 150–250 nm, and the silica particles have a particle size of greater than 100 nm. The silica may be fumed or colloidal. The slurry has a pH of approximately 9.0.

6 Claims, 1 Drawing Sheet

CERIA-BASED POLISH PROCESSES, AND CERIA-BASED SLURRIES

BACKGROUND OF THE INVENTION

The invention relates to semiconductor device fabrication and, more particularly, to techniques for CMP (Chemical Mechanical Polishing) and, more particularly, to ceria-based polish processes, particularly for CMP polishing of patterned oxides.

CMP is a key technology in the manufacture of high-density electronic circuits. The process uses advanced polishing techniques involving slurries—mixture of high-performance abrasives and chemicals. CMP technique is very important in the process for manufacturing a semiconductor device, for instance, shallow trench isolation (STI), planarization of interlayer dielectric, formation of embedded metal line, plug formation, formation of embedded capacitor, and the like.

A CMP process involves rotating a wafer against a polishing pad under pressure in the presence of a slurry. CMP is used to planarize silicon dioxide ("oxide"). For conventional oxide polishing, the slurry consists of a silica-based colloid suspended in a dilute alkaline solution (pH~10–11). The polishing pad is typically a composite porous polyurethane-based material. The theory of oxide polishing is not well understood; however, it is generally accepted that the alkaline chemistry hydrolyzes the oxide surface and sub-surface thus weakening the $SiO_2$ bond structure. The mechanical energy imparted to the colloid through pressure and rotation causes high features to erode at a faster rate than low features, thereby planarizing the surface over time.

The present invention is primarily directed to chemical mechanical polish (CMP) of oxides. In this process, wafers with silicon dioxide thin film are polished with the use of an abrasive mineral on a polishing pad. This art is practiced extensively in the glass polishing industry as well as in the semiconductor industry. The abrasive mineral is typically suspended in an aqueous medium that may also contain other chemicals to reduce the settling of the mineral and also to improve polish performance. The most commonly used abrasive minerals in the semiconductor industry for the purpose of planarizing silicon dioxide thin films are oxides of silicon and cerium. Cerium oxides are more popular for better planarizing performance, particularly for polishing patterned oxides. As used herein, patterned oxides include, but are not limited to, shallow trench isolation (STI), pre-metal dielectric (PMD) and interlevel dielectric ILD.

US Patent Application No. 2004/0040217 ("Takashina") discloses a polishing composition comprising an aqueous medium and abrasive particles, wherein the abrasive particles comprise abrasive particles having a particle size of 2 to 200 nm in an amount of 50% by volume or more, the abrasive particles having a particle size of 2 to 200 nm comprising (i) 40 to 75% by volume of small size particles having a particle size of 2 nm or more and less than 58 nm; (ii) 0 to 50% by volume of intermediate size particles having a particle size of 58 nm or more and less than 75 nm; and (iii) 10 to 60% by volume of large size particles having a particle size of 75 nm or more and 200 nm or less; a polishing composition comprising an aqueous medium and abrasive particles, wherein the abrasive particles comprise abrasive particles (A) having an average particle size of 2 to 50 nm; and abrasive particles (B) having an average particle size of 52 to 200 nm, wherein a weight ratio of A to B (A/B) is from 0.5/1 to 4.5/1; a polishing process comprising subjecting a semiconductor substrate to planarization with the polishing composition; a method for planarization of a semiconductor substrate with the polishing composition; and a method for manufacturing a semiconductor device, comprising polishing a semiconductor substrate with the polishing composition. The polishing composition can be favorably used in polishing the substrate for a semiconductor device, and the method for manufacturing a semiconductor device can be favorably used for manufacturing a semiconductor device such as memory integrated circuits (IC), logic ICs and system large scale integrated circuits (LSI).

As noted in Takashina, one example of a polishing liquid for CMP includes a dispersion of abrasive particles in water. The abrasive particles include particles of fumed silica, alumina and the like. Among them, the fumed silica is widely used because of its low cost and high purity. However, there is a disadvantage in the fumed silica that scratches are likely to be generated on the surface because aggregated particles (secondary particles) are formed in the production process. On the other hand, since silica abrasive grains which are referred to as "colloidal silica" have relatively spherical surface shape, and are in a state of nearly monodisperse, aggregated particles are hardly likely to be formed, so that reduction in scratches can be expected and that the silica abrasive grains have begun to be used. However, there is a disadvantage in the silica abrasive grains that the polishing rate is generally low.

As noted in Takashina, particles of silicon dioxide, aluminum oxide and cerium oxide are preferable, and silicon dioxide is more preferable from the viewpoint of reducing scratches. Concrete examples include silicon dioxide particles such as colloidal silica particles, fumed silica particles and surface-modified silica particles; and cerium oxide particles such as those having an oxidation number of 3 or 4 and those having hexagonal, isometric or face-centered cubic crystal system; and the like.

As noted in Takashina, colloidal silica particles are more preferable. The colloidal silica particles have a relatively spherical shape, which can be stably dispersed in the state of primary particles, so that aggregated particles are hardly formed, whereby scratches on a surface to be polished can be reduced. The colloidal silica particles can be prepared by a sodium silicate method using an alkali metal silicate such as sodium silicate as a raw material, or an alkoxysilane method using tetraethoxysilane or the like as a raw material. These abrasive particles may be used alone or in admixture of two or more kinds.

As noted in Takashina, the polishing compositions can optionally contain various additives. The additives include a pH adjusting agent, a dispersion stabilizer, an oxidizing agent, a chelating agent, a preservative, and the like.

The pH adjusting agent includes basic substances such as an aqueous ammonia, potassium hydroxide, sodium hydroxide and water-soluble organic amines, and acidic substances including organic acids such as acetic acid, oxalic acid, succinic acid, glycolic acid, malic acid, citric acid and benzoic acid, and inorganic acids such as nitric acid, hydrochloric acid, sulfuric acid and phosphoric acid. Here, oxalic acid and succinic acid can be also used as a chelating agent.

The dispersion stabilizer includes surfactants such as anionic surfactants, cationic surfactants and nonionic surfactants, polymeric dispersants such as polyacrylic acids or salts thereof, acrylate copolymers and ethylene oxide/propylene oxide block copolymers (Pluronics), and the like.

The oxidizing agent includes peroxides, permanganic acid or salts thereof, chromic acid or salts thereof, nitric acid or salts thereof, peroxo acid or salts thereof, oxyacid or salts thereof, metal salts, sulfuric acid, and the like.

The chelating agent includes polycarboxylic acids such as oxalic acid, succinic acid, phthalic acid and trimellitic acid; hydroxycarboxylic acids such as glycolic acid, malic acid, citric acid and salicylic acid; polyaminocarboxylic acids such as nitrilotriacetic acid and ethylenediaminetetraacetic acid; phosphonic acids such as aminotri(methylenephosphonic acid) and 1-hydroxyethylidene-1,1-diphosphon-ic acid, and the like.

The preservative includes benzalkonium chloride, benzethonium chloride, 1,2-benzisothiazolin-3-one, and the like.

As noted in Takashina, it is preferable that the pH of the polishing compositions is appropriately determined depending upon the kinds of the objects to be polished and the required properties. For instance, it is preferable that the pH of the polishing composition is preferably from 2 to 12, from the viewpoints of the cleanability of the objects to be polished, the anti-corrosiveness of the working machine, and the safety of the operator. In addition, when the objects to be polished are used for polishing a semiconductor wafer, a semiconductor element, or the like, especially for polishing a silicon substrate, a poly-silicon substrate, a silicon oxide film, or the like, the pH is more preferably from 7 to 12, still more preferably from 8 to 12, especially preferably from 9 to 12, from the viewpoints of increasing the polishing rate and improving the surface qualities. The pH can be adjusted by adding the above-mentioned pH adjusting agent properly in a desired amount as occasion demands.

US Patent Application No. 2003/0211747 ("Hegde et al.") discloses shallow trench isolation polishing using mixed abrasive slurries. Isolation of active areas, e.g., transistors, in integrated circuits and the like so that functioning of one active area does not interfere with neighboring ones, is provided by the shallow trench isolation technique followed by chemical-mechanical polishing with a mixed abrasive slurry consisting essentially of (a) relatively large, hard inorganic metal oxide particles having (b) relatively small, soft inorganic metal oxide particles adsorbed on the surface thereof so as to modify the effective charge of the slurry to provide more favorable selectivity of silicon dioxide to silicon nitride, the slurry having a pH below about 5.

As noted in Hegde, a mixed abrasive polishing slurry for the CMP process is provided consisting essentially of at least two inorganic metal oxide abrasive materials such as ceria ($CeO_2$) and alumina ($Al_2O_3$) particles at a pH below 5, e.g. on the order of ~4.0 or less in order to control the polish rate selectivity of oxide to nitride and to reduce surface defects.

The mixed abrasive slurries ("MAS") will consist essentially of a mixture of (a) small and soft particles and (b) relatively large and hard particles as will be described in detail hereinafter. The two kinds of slurry particles are selected to provide opposite polarity such that the smaller particles are attracted to and thereby preferentially adsorbed on the surface of the larger particles.

The large, hard particles in the slurry, which provide the necessary mechanical abrasion function of the slurry, will, for example, possess a mean particle size of on the order of from about 80 to 250 nm while the small, soft particles adsorbed on the surface of the large particles may, for instance, be on the order of from about 10–40 nm. The ratio of large to small particles may, for instance, be on the order of from about 1:1 to about 1:5 by weight, preferably from 1:1 to 1:1.2 by weight.

As examples of useful large particles, mention may be made of alumina, iron oxide, chromia, ceria, titania, germania and zirconia; while examples of useful materials for the small particles include silica, zirconia and ceria.

The schematic polishing mechanism of this invention illustrated in FIG. 4 shows how the small abrasive particles cluster around the surface of the large abrasive particles. As postulated by Hegde, when the modified abrasive containing small, soft ceria particles adsorbed onto large, hard alumina particles interact with the silicon dioxide substrate, first the unique chemical interaction of ceria with the silicon dioxide substrate softens the surface film of $SiO_2$ and then the hard alumina particles mechanically abrade the softened film. On the other hand, for $Si_3N_4$ to be removed at a faster rate, it has to be first oxidized to $SiO_2$ and only then the synergistic interaction of large and small particles in the modified abrasive can come into play to enhance the RR. At pH values below 5, the oxidation of $Si_3N_4$ to $SiO_2$ is very slow and hence the modified abrasive always interacts with hard $Si_3N_4$ surface film during polishing, leading to low $Si_3N_4$ RR and thus improving selectivity.

As noted in Hegde, since the ceria particles that interact with the polishing material are very soft, the resulting surface smoothness is excellent. This is the advantage of mixed abrasive slurry, where specific interactions between the abrasive and the polishing substrate can be appropriately tailored to control the removal rates of polishing materials to desirable values and simultaneously produce high post-polish surface quality (low surface roughness).

US Patent Application No. 2003/0092271 ("Jindal") discloses shallow trench isolation polishing using mixed abrasive slurries. Isolation of active areas, e.g. transistors, in integrated circuits and the like so that functioning of one active area does not interfere with the neighboring ones, is provided by the shallow trench isolation technique followed by chemical-mechanical polishing with a mixed abrasive slurry consisting essentially of at least two inorganic metal oxide abrasive material particles at a pH below five, preferably on the order of 3.5 to 4.0, in order to control the polish rate selectivity of silicon dioxide to silicon nitride of the circuit and to reduce surface defects. The mixed abrasive polishing slurry for the CMP process consists essentially of at least two inorganic metal oxide abrasive materials such as ceria ($CeO_2$) and alumina ($Al_2O_3$) particles at a pH below 5, e.g. on the order of about 4.0 or less in order to control the polish rate selectivity of oxide to nitride and to reduce surface defects.

As noted in Jindal, in the current generation devices, an improved isolation, greater packing density and superior dimensional control is achieved by the Shallow Trench Isolation method. Notably, Shallow Trench Isolation is formed by etching a trench through the silicon nitride and the silicon oxide layers into the silicon substrate to a predetermined depth. Silicon oxide is then deposited over the entire wafer and into the trench opening in the silicon nitride using a special technique known in the art as Chemical Vapor Deposition ("CVD"). Chemical-mechanical polishing is then applied to remove excess CVD silicon oxide and is stopped on the protective silicon nitride. The nitride is then etched out using strong, hot acids.

CMP must stop when the nitride layer is reached and this requires a very high oxide-to-nitride-selectivity-slurry for CMP. In the CMP process, as the name of the process infers, planarization is achieved through the contributions of both chemical reactions and mechanical abrasion. The chemical reactions take place between the slurry and the material being polished. Mechanical abrasion of the film is caused by the interaction between the pad, the abrasives and the film.

Accordingly, the three major components of a CMP process are the film, the pad and the slurry. Since the process is very well known in the art, including its essential components, it need not be discussed in much detail herein.

Of these three major components, it is stressed that the use of highly selective slurries which yield minimal defects in the shallow trench isolation procedure is by far the most critical for providing a commercial product. Accordingly, it is stressed that providing highly selective slurries which yield minimal defects after chemical-mechanical polishing of the shallow trench isolation is essential for a vitally important and commercial shallow trench isolation system.

US Patent Application No. 2003/0047710 ("Babu et al.") discloses chemical-mechanical polishing. An abrasive slurry for chemical-mechanical polishing, e.g. to planarize metal and silicon wafers employed in the fabrication of microelectric devices and the like, the slurry consisting essentially only of a mixture of at least two inorganic metal oxides to provide superior performance in properties such as improved oxide and metal polish rates, controlled polish rate selectivity, low surface defectivity and enhanced slurry stability over that obtainable with a single inorganic metal oxide abrasive material.

As noted in Babu, the abrasives in the slurry play the very important role of transferring mechanical energy to the surface being polished. Illustrative abrasives for this purpose include silica (silicon dioxide, $SiO_2$) and alumina (aluminum oxide, $Al_2O_3$). Ceria (cerium dioxide, $CeO_2$) is the most popular abrasive for the polishing of the glass and (recently) oxide films for STL.

The abrasive-liquid interactions, through chemical and physical actions, play a very important role in determining the optimum abrasive type, size, shape and concentration. The abrasives, however, can also have a chemical effect as in the case of glass polishing with ceria abrasives where the ceria forms a poorly understood chemical bond with the glass surface.

As noted in Babu, CMP is per se old and has, for example, been used in glass polishing and silicon wafer polishing prior to integrated circuit fabrication for quite some time. Silicon dioxide employed in integrated circuit manufacturing is a form of silicate glass, so the two materials have similar mechanical and chemical properties. Silicon dioxide polishing is typically performed near pH 10 because of enhanced dissolution and chemical interaction in that pH regime. The dissolution rate is enhanced by the compressive stress that occurs during particle abrasion. Ceria and zirconia have been found to possess a special "chemical tooth" property that increases the silicon oxide removal by many orders of magnitude.

As noted in Babu, conventionally, silica particles alone have been used as the abrasives for silicon oxide and nitride polishing. Ceria-based slurries, which have high removal rates of oxide and high polish rate selectivity of oxide to nitride often cause slurry-induced scratches on the oxide surface. These scratches are detrimental to proper functioning of the integrated circuit devices. Deep scratches should be eliminated because they may attack the silicon substrate and negate oxide integrity.

BRIEF DESCRIPTION (SUMMARY) OF THE INVENTION

It is a general object of the invention to provide an improved technique for CMP polishing of oxides.

According to the invention, generally, small quantities of silica are combined with ceria-based slurries to initiate oxide polish faster thereby increasing throughput and minimizing process instability due to changes in the initiation time with silica-less slurries. This minimizes the dead time at the beginning of the polish process thereby enhancing the throughput of the polish process.

The silica in the slurry accelerates the onset of polishing. The ceria in the slurry interacts with the oxide surface, that is exposed as a result of the initial polish with silica, and continues to polish.

According to the invention, a method for chemical mechanical polishing (CMP) patterned oxides using a ceria-based slurry, comprises the steps of: adding a quantity of silica to the slurry; wherein a ratio of ceria concentration to silica concentration (ceria:silica) is from approximately 10:1 to nearly 1:1 by weight. The concentration of ceria in the slurry is approximately 1.0–5.0 wt %; and the concentration of silica in the slurry is approximately 0.1–5.0 wt %. The ceria particles have a particle size of 150–250 nm: and the silica particles have a particle size of >100 nm. The method is useful for patterned oxides which are shallow trench isolation (STI), premetal dielectric (PMD) and interlevel dielectric (ILD).

According to the invention, a slurry for performing chemical mechanical polishing (CMP) of a oxides on a substrate, comprises: ceria particles having a first concentration; silica particles having a second concentration; wherein the concentration of ceria in the slurry is approximately 1.0–5.0 wt %; and the concentration of silica in the slurry is approximately 0.1–5.0 wt %. A ratio of ceria concentration to silica concentration (ceria:silica) is from approximately 10:1 to nearly 1:1 by weight. The ceria particles have a first particle size and the silica particles have a second particle size; and a ratio of first particle size to second particle size (ceria:silica) is selected from the group consisting of approximately 1:1, approximately 1.5:1, approximately 2:1, and approximately 2.5:1. The ceria particles have a particle size of 150–250 nm: and the silica particles have a particle size of greater than 100 nm. The silica may be fumed or colloidal. The slurry has a pH of approximately 9.0.

According to the invention, a method of CMP polishing patterned oxide comprises the steps of using a ceria-based slurry having an initiation time; and adding a sufficient quantity of silica to the ceria-based slurry to substantially reduce the initiation time and increase process stability while maintaining essential beneficial qualities of the ceria-based slurry.

Adding silica to ceria-based CMP slurries is beneficial because:

the polish process to start much faster than without silica thereby eliminating the dead time in the polish process.

it also eliminates the process instability caused by changes in the dead time with operating conditions.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
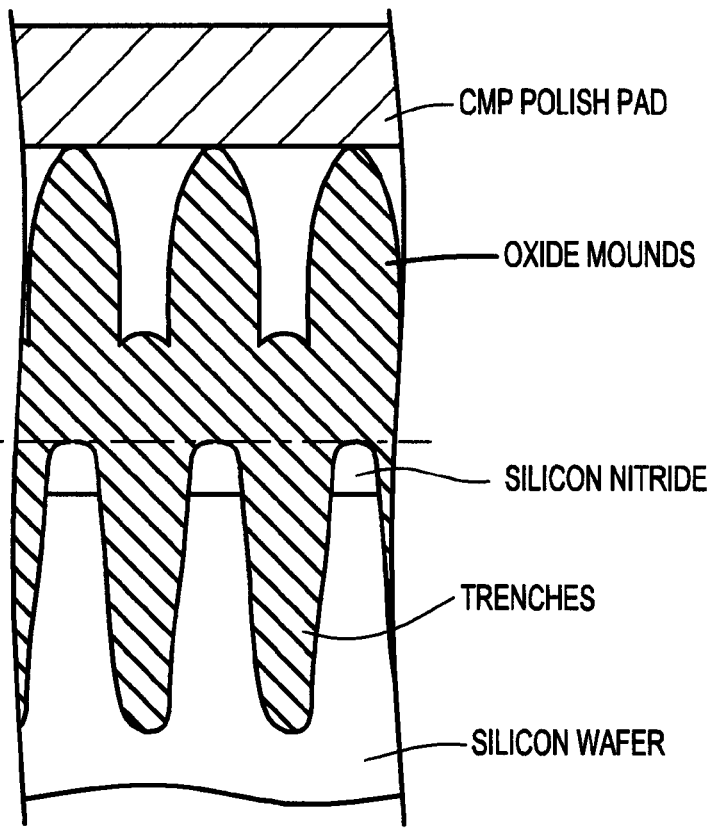

In the drawings accompanying the description that follows, often both reference numerals and legends (labels, text descriptions) may be used to identify elements. If legends are provided, they are intended merely as an aid to the reader, and should not in any way be interpreted as limiting.

Often, similar elements may be referred to by similar numbers in various figures (FIGs.) of the drawing, in which case typically the last two significant digits may be the same, the most significant digit being the number of the drawing figure (FIG).

FIG. 1 is a cross-sectional view of a semiconductor wafer having a typical STI (shallow trench oxide) structure having a plurality of shallow trenches.

Figure 2:
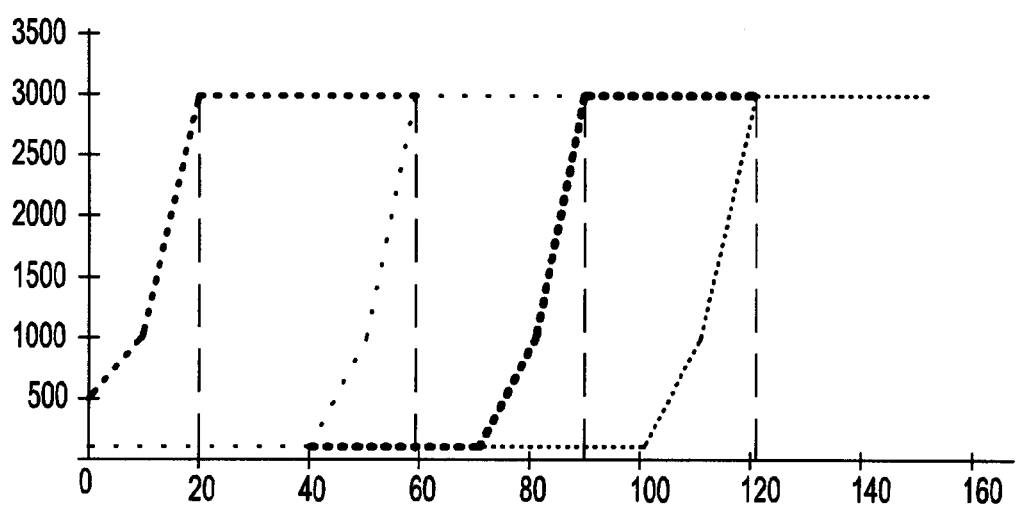

FIG. 2 is a graph illustrating the effect of initiation time on the total amount of material removed, for slurries having four different initiation times. The horizontal axis is time in seconds. The vertical axis is material removal rate in Angstroms (Å) per minute.

DETAILED DESCRIPTION OF THE INVENTION

In the description that follows, numerous details are set forth in order to provide a thorough understanding of the present invention. It will be appreciated by those skilled in the art that variations of these specific details are possible while still achieving the results of the present invention. However, well-known processing steps may not be described in detail in order to avoid unnecessarily obfuscating the description of the present invention.

Materials (e.g., silicon dioxide) may be referred to by their formal and/or common names, as well as by their chemical formula. Regarding chemical formulas, numbers may be presented in normal font rather than as subscripts. For example, silicon dioxide may be referred to simply as "oxide", chemical formula $SiO_2$. For example, silicon nitride (stoichiometrically $Si_3N_4$, often abbreviated as "SiN") may be referred to simply as "nitride".

In the description that follows, exemplary dimensions may be presented for an illustrative embodiment of the invention. The dimensions should not be interpreted as limiting. They may be included to provide a sense of proportion. Generally speaking, it is the relationship between various elements, where they are located, their contrasting compositions, and sometimes their relative sizes that is of significance.

One of the integration schemes in the semiconductor processing industry where oxide CMP is critical is Shallow Trench Isolation (STI). In this scheme, trenches are etched in the regions of the wafer where isolation of neighboring devices is required. Oxide (typically silicon dioxide) is then filled (deposited) in these trenches. During the deposition process oxide mounds are deposited in the regions of the wafer that do not have any trenches.

FIG. 1 illustrates of a semiconductor wafer having a typical STI (shallow trench oxide) structure having a plurality of shallow trenches. The areas (for purposes of this discussion, "mesas") between the trenches are typically capped with nitride (serving as a hard mask and later in the process serving as a CMP etch stop). Oxide is deposited using well-known conformal oxide deposition. The oxide overfills the trenches, and forms mounds atop the mesas. Typical exemplary dimensions are:

trenches/mounds spacing=0.2578 μm (e.g., center-to-center)

space between adjacent mounds=0.1061 μm trench width=0.2500 μm mound height=0.3321 μm thickness of oxide over nitride to bottom of mound=0.1705 μm nitride thickness=0.1000 μm trench depth=0.3321 μm CMP is then employed to remove all of these oxide mounds from regions of the wafer where there are no trenches (i.e., the mesas) while ensuring minimal oxide loss from within the trenches. The horizontal dashed line atop the nitride indicates that the oxide will be planarized, polished down to the level of the nitride which acts as a polish stop.

During CMP, the wafer contacts the polish pad through the oxide mounds. (The polish pad is shown grossly out-of-scale.) The effective pressure therefore is determined by the surface area of the oxide mounds that are in contact with the polishing pad. Due to the "pointed" profile of the oxide mounds, the contact area is the least in the initial stages of polish and increases as polish progresses.

For advanced technologies, such as 0.13 μm and lower, as the spacing between the trenches reduces and the depth of the trench increases, the oxide mounds become increasingly pointed thereby further reducing the contact surface area between the pad and the wafer in the initial stages of polish.

Existing literature on oxide CMP indicates that higher contact pressure between the wafer and the removal rate results in higher material removal from the wafer surface. (see Chemical Processes in Glass Polishing, Cook L. M., J. of Non-crystalline Solids, Vol. 120, pp 152–171; see also A CMP model combining density and time dependencies, Taber H. Smith et al., 1999 CMP-MIC conference proceedings.) This would indicate that the oxide mounds should polish faster in the initial stages of polish and the removal process must slow down as the polish process progresses.

This however is not the case while polishing with cerium oxide based slurries. In this case the oxide removal rate is very low in the initial stages of polish when the oxide mounds on the wafer surface are the tallest.

Further polishing results in material removal from these mounds thereby flattening them progressively. The material removed from these mounds on wafer surface could then become suspended and aid in further removal of material from the wafer surface. This results in a constant increase in the amount of material in suspension as the wafer polishing progresses causing change in the removal rate during the course of polishing a single wafer.

As more and more wafers are polished the abrasive material from the slurry and the material removed from the wafer surface could become embedded in the pad, in turn causing a change in the removal rate as the pad ages.

According to the invention, a quantity of silicon dioxide (fumed and/or colloidal silica) is added to the cerium oxide (ceria) based slurry in order to minimize the effect that the removed material has on subsequent polishing. The silicon dioxide in the resulting slurry causes material removal to begin very early on in the polish process without relying on the material removed from the wafer surface to aid in polishing.

It is believed that the mechanism responsible for this beneficial result is that the cerium oxide abrasive does not selectively adhere well to the surface of the wafer. This results in a very low initial removal rate. The oxide that is removed from the wafer in the initial stages of polish then adheres to the remaining oxide on the wafer and increases the removal rate. The added silica abrasive adheres better to the surface of the oxide thereby enhancing its removal rate.

This increases the removal rate in the initial stages of polishing and also improves the process stability by providing an abundance of silicon dioxide to the polishing system consistently.

It is within the scope of the invention that surface-modified silica particles and ceria particles such as those having an oxidation number of 3 or 4 and those having hexagonal, isometric or face-centered cubic crystal system; and the like, can be used in the slurry.

It is within the scope of the invention that polishing compositions can optionally contain various additives, including a pH adjusting agent, a dispersion stabilizer, such as those described in Takashina. It is also within the scope of the invention that the slurry can contain an oxidizing agent, a chelating agent, and a preservative, such as those described in Takashina although they generally do not apply for oxide CMP.

Experimental Results

Wafers having 5700 Å of oxide (mounds) were CMP polished using a ceria-based slurry and two silica doped slurries, and were polished for 120 seconds. The thickness of the oxide remaining after 120 seconds of polishing was measured. The following TABLE presents the results from adding silica to the slurry.

TABLE

Proof of concept: Polishing results from silica addition

|  | Oxide remaining after 120s of polishing |
|---|---|
| Ceria Based slurry (1.0 wt %.) | 1942 Å |
| 1.2 wt % silica doped slurry | 1110 Å |
| 0.6 wt % silica doped slurry | 1116 Å |

In all three slurries, the amount (concentration) of ceria in the overall slurry was 1.0 wt %. From the TABLE, it is evident that adding silica to the ceria-based slurry improves polishing performance. The concentrations (wt %) of silica are set forth in the TABLE. In one case (1.2 wt % silica doped slurry), there was slightly more silica than ceria, for experimental purposes. In the other case (0.6 wt % silica doped slurry), there is less silica than ceria. As a general proposition, it is believed that less than 1.0 wt % silica is adequate to achieve the desired results.

According to the invention, an effective slurry for CMP polishing patterned oxides on semiconductor wafers, particularly STI structures, comprises:

the amount of ceria in the slurry should be approximately 1.0–5.0 wt %.

the amount of silica added to the ceria-based slurry should be approximately 0.1–5.0 wt %.

the ratio of ceria: silica should be from approximately 10:1 to nearly 1:1 by weight, including the following exemplary ranges:

from 10:1 to 7:1
from 10:1 to 4:1
from 10:1 to 1.1:1
approximately 10:1
approximately 7:1
approximately 4:1
greater than 1:1
greater than 4:1
greater than 7:1

The amount of silica added the slurry should be sufficient to substantially reduce the initiation time and increase process stability (discussed below).

It is believed that adding any less than 1 part in 0 silica (e.g., 20:1) would be too little silica to be of any use. So, the amount of silica added should be less than the amount of ceria in the slurry, including nearly equal to (1.1:1), but not much less (greater than 10:1).

In any case, it is desirable that the silica concentration should be less than the concentration of ceria to maintain the essential beneficial qualities of the ceria-based slurry.

Further according to the invention, the ceria should have a particle size of 150–250 nm (including 180–220 nm). The silica added to the ceria-based slurry can be fumed or colloidal having the following particle sizes.

| for fumed silica | 130–190 nm |
|---|---|
| for colloidal silica | over 100 nm |

A useful range of sizes for the silica particles is 100–200 nm.

From the particle sizes specified above, we see that the size ratios for ceria:silica can be:

| approximately 1:1 | (e.g., 180:180) |
|---|---|
| approximately 1.5:1 | (e.g., 150:100, 180:120, or 210:140) |
| approximately 2:1 | (e.g., 200:100) |
| approximately 2.5:1 | (e.g., 250:100) |

The invention works well with large ceria particles and large fumed silica particles, having about the same sizes. The silica particles are preferably no larger than the ceria particles.

A useful slurry has ceria 150–250 nm, and silica (fumed or colloidal) above (greater than) 100 nm.

The chemistry of the slurry is aqueous (water).

The pH of the slurry is in the range of from 7–12, such as approximately 9.0 (9±0.5). The pH can be adjusted by adding a pH adjusting agent properly in a desired amount as occasion demands.

The resulting ceria-based slurry with added silica exhibits less dependency on pattern density. When polishing patterned oxide, it polishes more uniformly, including doped oxides, including STI, PMD, ILD.

The Polishing Mechanism

Conventional thinking is that ceria-based slurries rely on the "chemical tooth" property to polish oxide. For this to happen, the ceria particles need to be in contact with the surface of the oxide, trapped between the pad and the oxide surface. In the initial stages of polish, due to the wafer topography, there is a limited amount of oxide surface area that contacts the pad. Hence there are few ceria particles that effectively polish the oxide. As polishing progresses, at a very slow rate, more and more of the surface topography is flattened thereby increasing the oxide surface area trapping more ceria between the oxide surface and the pad. Also more oxide (silica) from the wafer is removed and in turn aids further polishing of the oxide from the wafer. The combined effect of, increasing silica in the slurry (from the material that is removed) and the flattening of wafer topography, results in an increase in the polish rate.

According to the invention, the polish mechanism is altered by addition of silica to the slurry. Also, a steady concentration of silica in the slurry results in a steady polish rate of oxide. The reliance on the initial stages of polish with pure ceria slurries to produce silica for further polishing is thereby eliminated.

FIG. 2 illustrates graphically the effect that initiation time (also referred to herein as "dead time") has on the total amount of material (e.g., oxide) removed, for slurries having four different initiation times. The horizontal axis is time in seconds. The vertical axis is material removal rate in Angstroms (Å) per minute. All four slurries have a maximum material removal rate of 3000 Å/minute (in all four cases). This is not experimental data, but is based on measurements such as those (removal rates) which were discussed hereinabove.

The dashed line (curve) is for a CMP slurry having a 100 second (s) initiation time and ramping up to the maximum material removal rate in 20 seconds (at 120 seconds).

The line (curve) with triangles is for a CMP slurry having a 70 second initiation time and ramping up to the maximum material removal rate in 20 seconds (at 90 seconds).

The line (curve) with squares is for a CMP slurry having a 40 second initiation time and ramping up to the maximum material removal rate in 20 seconds (at 60 seconds).

The line (curve) with circles is for a CMP slurry having an initiation time of substantially 0 seconds and ramping up to the maximum material removal rate in 20 seconds (at 20 s).

The total oxide removed is the area under each of the curves. Certain reasonable inferences and conclusions can be drawn from FIG. 2. As initiation time reduces within a lot (dead time changes with operating conditions), the total oxide removed increases, causing overpolishing. Since the addition of silica to the slurry reduces the overall initiation time, the overpolish amount is reduced resulting in an increase the process stability. An overall reduction in the initiation time will reduce the total process time thereby increasing throughput.

Polishing is deemed to be finished when all of the oxide atop the nitride (hard mask, polish stop) is removed. To remove a typical amount (~6000 Å) of oxide, a total time of 180–240 seconds is normally required.

The following comparison can be made. Using 240 seconds as the baseline, for the 100 sec initiation time situation, there is a 20 second ramp up, and 120 seconds of polishing at max rate, commencing 120 seconds into the process. 100 of the 240 seconds are, in effect, wasted.

When the initiation time is reduced to zero, there is also a 20 second ramp up and 120 seconds of polishing at max rate, commencing substantially immediately. The total process takes 140 seconds instead of 240 seconds (a difference of 100 seconds)

Using these examples, the total process time can therefore be reduced by up to approximately 100 s/240 s=approximately 40%.

According to the invention, total process time using the silica-doped, ceria-based slurry can be reduced by at least 10%, including at least 20%, including at least 30%, including approximately 40% as compared with silica-less, ceria-based slurry. The increase in throughput can be substantial, depending on the actual processes being used. An input increase of 3–4 wafers per hour (WPH) can be achieved. (The comparison is with a known process that has a total polish time of approximately 210 s. With the proposed slurry composition the process time can be reduced by nearly 60 s which would result in an increase of approximately 3 WPH.)

The initiation period depends on the topography which in turn depends on the technology node of the product being processed. For some technologies the initiation time is of the order of 20 s while for others it is of the order of 90–240 s. Ad advantage of the invention is that the addition of silica to the slurry would reduce the initiation time to be substantially the same for all products. The theory is that the initiation time extends up to the point when enough oxide is removed from the surface of the wafer. So, the products for which the initiation time is very less, there will not be much change in the initiation time. But for other products where initiation time is a significant portion of the polish process, the addition of silica would reduce the initiation time (probably to less than 10% of the total polish time.).

Differentiating the Present Invention

In US Patent Application No. 2004/0040217 ("Takashina"), discussed above, the component abrasives, that are chemically different, have to be of different size, one being 52 to 200 nm and the other 2 to 50 nm. In contrast thereto, in the present invention one of component abrasives is 130–190 nm while the other is 150–250 nm (180–220 nm).

In US Patent Application No. 2003/0211747 ("Hegde et al."), discussed above, discloses a polishing slurry that has more silica than ceria in the slurry. The lowest silica content slurry that they claim has a 1:1 ratio of silica to ceria. In the present invention, the slurry has more ceria than silica (less silica than ceria). Therefore, Hegde's slurry will behave differently than the slurry of the present invention. The slurry of the present invention has more ceria than silica, it is a ceria-based slurry with silica being used as an "additive" not to exceed the concentration of ceria in the slurry.

In Hegde, the slurry pH should be below 5. The present invention is specified as running in a higher, near alkaline, pH regime, from 7–12, such as approximately 9.0 (9±0.5).

Hedge's particle sizes are different than those of the present invention. Hegde's particle sizes are:
 large ceria: 80–250 nm
 small silica: 10–40 nm
 The particle sizes in the present invention are:
 ceria: 150–250 nm (180–220 nm)
 silica: at least 100 nm, such as 100–200 nm, such as 130–190 nm
 Hegde's concentration ratios are:
 ceria:silica 1:1 to about 1:5 by weight (they have at least as much silica as ceria).

In the slurry of the present invention, ceria is the majority component and the concentration ratios: The concentration ratios are:
 ceria:silica 10:1 to about 1:1, as described hereinabove.

US Patent Application No. 2003/0092271 ("Jindal"), discussed above, discloses mixed abrasive slurries wherein the mixed components are alumina and ceria. The present invention is for a slurry having ceria and silica. Jindal's overall slurry pH is less than 4.0. The present invention operates at a higher, near alkaline, pH regime.

US Patent Application No. 2003/0047710 ("Babu et al.") discloses chemical-mechanical polishing. They talk about mixtures of alumina with silica and alumina with ceria. They do not talk of improved process stability (or any other benefits) which may result from mixing ceria and silica, as in the present invention.

Generally speaking, people have tended to use either all ceria-based or all silica-based slurries in the industry. And, the literature points out that patterned wafers polish faster than blanket wafers which makes our observations of dead time very non-obvious. The inventors have found adding small quantities of silica to the ceria-based slurries reduces/ eliminates the dead time. Since the issue of dead time in the STI CMP is (to the inventors' knowledge) not yet reported in literature, the solution to the problem offered by the present invention is therefore non-obvious.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A slurry for performing chemical mechanical polishing (CMP) of oxides on a substrate, comprising:

ceria particles having a first concentration; and silica particles having a second concentration, wherein the concentration of ceria in the slurry is approximately 1.0–5.0 wt %;

the concentration of silica in the slurry is approximately 0.1–5.0 wt %;

wherein a ratio of ceria concentration to silica concentration (ceria:silica) is from approximately 10:1 to nearly 1:1 by weight;

the ceria particles have a particle size of 150–250 nm; and the silica particles have a particle size greater than 100 nm;

wherein the silica particles comprise fumed silica; and wherein the slurry has a pH in the range of from 7–12.

2. The slurry of claim 1, wherein the ratio of ceria:silica is selected from the group consisting of from 10:1 to 7:1; from 10:1 to 4:1; from 10:1 to 1.1:1; approximately 10:1; approximately 7:1; approximately 4:1; greater than 4:1; and greater than 7:1.

3. The slurry of claim 1, wherein the ceria particles have a first particle size and the silica particles have a second particle size; and a ratio of first particle size to second particle size (ceria: silica) is selected from the group consisting of approximately 1:1; approximately 1.5:1; approximately 2:1; and approximately 2.5:1.

4. The slurry of claim 1, wherein the ceria particles have a particle size of 180:220 nm; and the silica particles have a particle size of 130:190 nm.

5. The slurry of claim 1, wherein the slurry has a pH of approximately 9.0.

6. The slurry of claim 1, wherein the slurry has a pH in the range of from 8.5 to 95.

* * * * *